United States Patent [19]

Kurosawa

[11] Patent Number: 5,262,686
[45] Date of Patent: Nov. 16, 1993

[54] DIFFERENTIAL CHOPPER TYPE COMPARATOR

[75] Inventor: Tatsuyuki Kurosawa, Tokyo, Japan

[73] Assignee: Texas Instruments Incorporated, Dallas, Tex.

[21] Appl. No.: 800,808

[22] Filed: Nov. 27, 1991

[30] Foreign Application Priority Data

Nov. 30, 1990 [JP] Japan .................. 2-339474

[51] Int. Cl.$^5$ .............................................. H03K 5/24
[52] U.S. Cl. .................... 307/362; 307/359; 307/491; 307/494
[58] Field of Search .......... 307/350, 355, 356, 362, 307/491, 494, 572

[56] References Cited

FOREIGN PATENT DOCUMENTS 0185017 7/1989 Japan .................... 307/355

Primary Examiner—John Zazworsky
Attorney, Agent, or Firm—William E. Hiller; Richard L. Donaldson

[57] ABSTRACT

Differential chopper type comparator including a switching circuit which switches between a reference signal and an input signal according to a connected first period and second period, first and second comparator circuits, and a differential comparator circuit differentially comparing the outputs of the first and second comparator circuits. Each of the first and second comparator circuits comprises a capacitor, an inverter serially connected to the capacitor, and a switch that short-circuits the input/output terminal of the inverter during the first period. The first and second comparator circuits operate in tandem such that the reference signal is input to the firs comparator circuit during the first period when the inverter is short-circuited, while conversely the input signal is input to the second comparator circuit during the first period when its inverter is short-circuited, with the reverse occurring with respect to the first and second comparator circuits during the second period. A comparison as between the size of the input and reference signals is accomplished by the first comparator circuit, and a comparison as between the size of the reference and input signals is accomplished by the second comparator circuit. The outputs of the first and second comparator circuits are then provided to the differential comparator circuit which produces a resultant comparative output effectively free of noise even when the environment is of a high noise level.

4 Claims, 3 Drawing Sheets

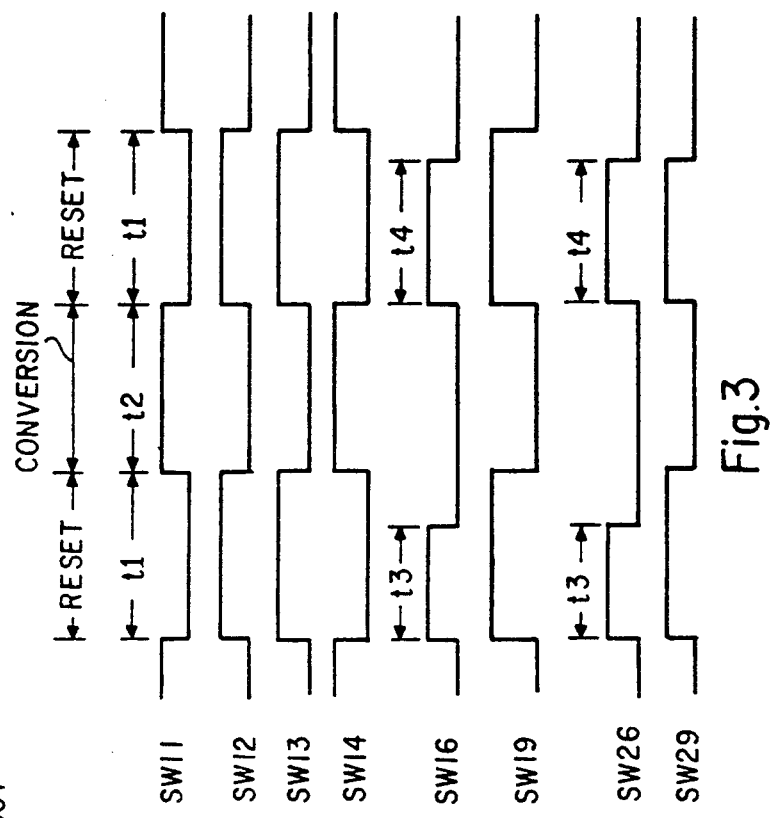
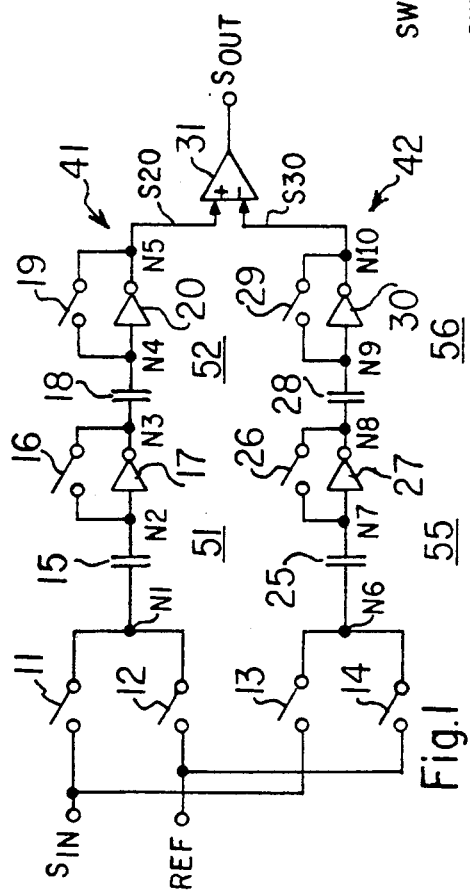
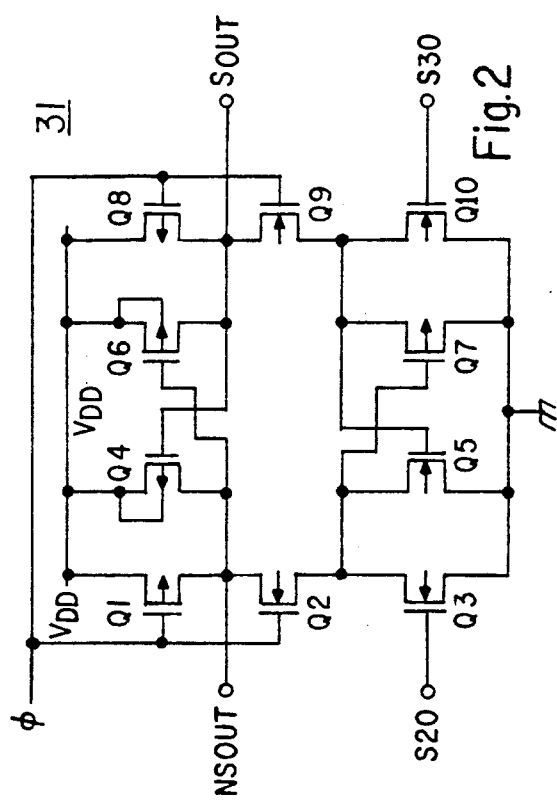

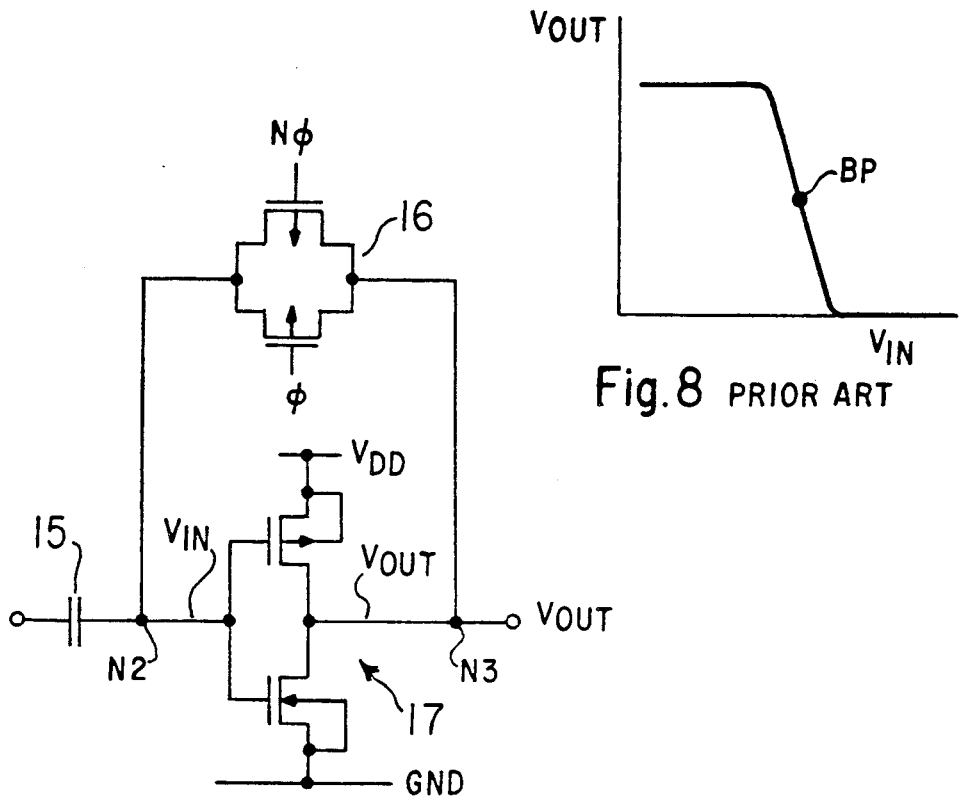
Fig. 8 PRIOR ART
Fig. 7 PRIOR ART
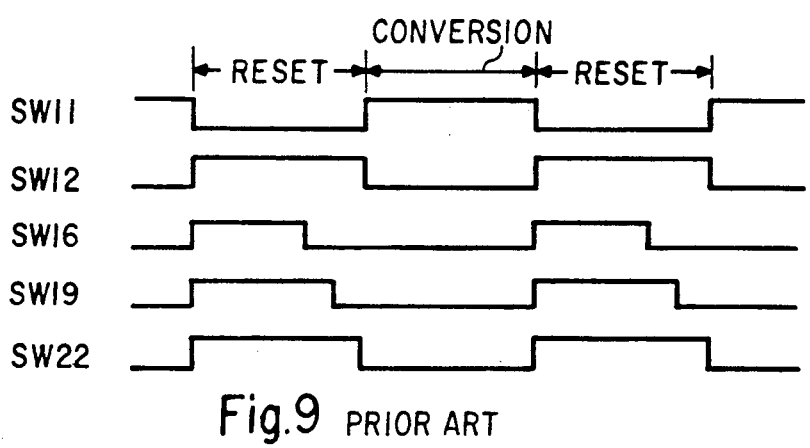
Fig. 9 PRIOR ART

DIFFERENTIAL CHOPPER TYPE COMPARATOR

FIELD OF THE INVENTION

The present invention relates to a chopper type comparator, and relates in particular to a differential chopper type comparator with improved noise resistance characteristics to be used in an analog/digital conversion device (A/D converter).

PRIOR ART

Comparators using differential amps, and chopper type comparators using inverters are used as comparators in which A/D amps are used.

Although comparators using differential amps built with CMOS are advantageous in being highly resistant to noise, they are problematic in that it is not possible to reduce size of offset errors due to fluctuations in the gate threshold value of the MOS transistor itself, which is used to construct the differential amp. In addition, their circuit structure is also problematic in being complex. In addition, since it is necessary to use a capacitor with relatively high precision, when the A/D converter is to be mounted on the same IC chip with other circuits, such as a digital signal processor (DSP) or microcomputer, it is problematic in that it is not possible to directly use the manufacturing processes which have been developed for the formation of ordinary digital circuits.

On the other hand, since it is possible to manufacture chopper type comparators using inverters with the same manufacturing processes used for other digital circuits while providing little offset error, there is the advantage of being able to mount them together with digital circuits on the same IC chip.

FIG. 6 shows a circuit diagram of a 1-bit chopper type comparator for a conventional A/D converter used as an A/D converter. This chopper type comparator consists of switches (11) and (12), which operate in opposite fashion during the resetting period and conversion period; circuits (51)-(53), which are serially connected in three steps; and an inverter (24).

In the circuit (51) at the first step, which functions as a comparator, an input capacitor (15), analog switch (16) and inverter (17) are connected as shown in the figure.

FIG. 7 shows a detailed circuit diagram of the comparator circuit (51). The inverter (17) is structured as a CMOS inverter, in which a p-channel MOS transistor and n-channel MOS transistor are connected as shown in the figure. FIG. 8 shows the input voltage $V_{in}$ and output voltage $V_{out}$ characteristics of the inverter (17). The switch (16) is an analog switch which operates according to a clock $\phi$, which is connected in parallel to a p-channel MOS transistor that operates according to an inverted clock $N\phi$.

The circuit (52) at the second step consists of a capacity coupling capacitor (18), switch (19), and inverter (20), and has the circuit structure shown in FIG. 7. This component functions as an inverted amplifier circuit. The circuit (53) at the third step has the same circuit structure as the circuit (52) at the second step, and functions as an inverted amplifier circuit.

The operations of the aforementioned circuits will be explained with reference to the timing chart of FIG. 9. In this figure, SW11, SW12, SW16, SW19, and SW22 respectively denote the on (closed) state and off (open) state of the analog switches (11), (12), (16), (19), and (22).

In an A/D converter, the resetting period and conversion period are repeated in turn.

During the resetting period, only the switch (11) is turned off, while the other switches (12), (16), (19), and (22) are turned on. Thus, a reference voltage signal REF is applied to a node N1 through a switch (12) to short-circuit the input/output terminals of the inverters (17), (20), and (23) inside the comparator circuits at each step.

Next, the switches (16), (19), and (22) are turned off in order. The reason the turning off operation is carried out in this sequence is to prevent the circuits in the following steps from being affected by the circuits in the preceding steps.

During the conversion period, the switch (12) is turned off at the same time that the switch (11) is turned on. Thus, a conversion voltage signal $S_{in}$ is applied to the node N1.

The operations of the comparator circuit (51) during the above operations will be explained below with reference to FIGS. 7 and 8.

During the resetting period, the analog switch (16) is turned on, thereby short-circuiting the input/output terminal of the inverter (17), which subjects the inverter (17) to direct current total feedback. Its output becomes equivalent to the central value ($V_{in}/2$) of the input voltage $V_{in}$, thus allowing the inverter (17) to be set as an amp to the maximum position in the gradient of FIG. 8, i.e., to the bias point BP with the highest gain. This maximum gain is in the range of a hundredfold increase. Thus, the offsetting in the inverters (17) cancel each other out. During this time, the input capacitor (15) is charged with a differential voltage = (reference voltage $V_{ref}$ – input voltage $V_{in}$).

When the switches (12) and (16) are turned off, the discharge path of the input capacitor (15) is cut off, thus allowing the end-to-end voltage of the input capacitor (15) to be maintained without change.

When the conversion period begins, the switch (11) is turned on, which changes the voltage of the node N2 on the output end of the input capacitor (15) to become the value expressed below.

Conversion input voltage $V_{cin}$ – (reference voltage $V_{ref}$ – input voltage $V_{in}$)     (1)

This voltage is compared with the reference voltage of the inverter (17) itself. If the voltage ($V_{ref}$) of the reference voltage signal REF is greater than the voltage ($V_{cin}$) of the conversion input voltage signal $S_{in}$, then the output level of the node N3 on the output side of the inverter (17) will turn to the "low" level; otherwise it will turn to the "high" level.

Thus, the comparator circuit (51) at the first step has a self-correcting comparator structure in which the offsettings cancel each other.

The circuits (52) and (53) at the second and third steps also have the same self-correcting comparator circuit construction as the comparator (51) at the first step. The offsets in the inverters (20) and (23) are canceled out when the switches (19) and (22) are turned on. However, these circuits functions as inverted amplifier circuits with an amplification of nearly 100, thus providing as comparator output signals $S_{out}$, at the required level.

In addition, since the signals are inverted by the comparator circuits at each step, an inverter (24) is connected to the final step to match the polarity and for logic output.

When an A/D converter using the aforementioned chopper type comparator is to be mounted on a single IC chip together with digital signal processing circuits, the switching noise generated by the digital signal processing circuits enters the power line of the chopper type comparator, thus increasing the offset voltage. With a comparator circuit in which the aforementioned CMOS inverters are used, the voltage difference between the input voltage $V_{in}$ and the reference voltage signal REF, which is the bias voltage occurring during resetting, is amplified. However, if there are fluctuations in the power source voltage, nearly ½ of this fluctuating voltage will be taken as a fluctuation in the input voltage $V_{in}$. As a result, it is not possible to increase the power source voltage removal ratio (PSRR) with the aforementioned comparator circuit alone, which is problematic in causing an increase in errors in the A/D converter due to the power source voltage fluctuations.

In addition, the nodes N2, N4, and N6, which have high impedance during the A/D converter conversion, are adversely affected by the coupling between the semiconductor substrate and the power source voltage, on which the switching noise emitted from the digital signal processing circuits is superimposed. Thus, when the difference between the input voltage and reference voltage is small, the coupling noise causes the problem of malfunctioning in the chopper type comparator. This causes the problem of even more severe differential nonlinearity errors in the A/D converter.

In addition, when the analog switches (16), (19), and (22) of the comparator circuits at each step are turned on and off, clock feedthrough is generated, which is problematic in causing A/D converter malfunctions.

Although the chopper type comparator has been described above for use in an A/D converter, it is problematic in the same manner when used as a comparator circuit in other situations.

Thus, it is an object of the present invention to provide comparator which is not easily subject to the influence of noise such as switching noise from the digital circuits, and which is not easily adversely affected by the operation of analog switches installed in the same circuit.

SUMMARY OF THE INVENTION

In order to solve said problems, a differential comparator circuit construction is used with the present invention.

Specifically, the differential chopper type comparator of the present invention comprising: (1) a switching circuit which switches between a reference signal and input signal according to a connected first period and second period; (2) a first comparator circuit, which comprises a capacitor, an inverter that is serially connected to said capacitor, and a switch that short-circuits the input/output terminal of said inverter during the first period, wherein the reference signal from said switching circuit is input during the first period, and the input signal from said switching circuit is input during the second period to compare the size of the input signal with respect to the reference signal; (3) a second comparator circuit, which comprises a capacitor, an inverter that is serially connected to said capacitor, and a switch that short-circuits the input/output terminal of said inverter during the first period, wherein the input signal from said switching circuit is input during the first period, and the reference signal from said switching circuit is input during the second period to compare the size of the reference signal with respect to the input signal; (4) and a differential comparator circuit which differentially compares the outputs of the first and second comparators.

The first and second comparator circuits are constructed as self-correcting comparator circuits which comprise said input capacitors, inverters, and switches. Thus, these comparator circuits are circuits which are self-canceling.

The first and second comparator circuits perform opposite comparison operations by using different signals as input during the first period and second period. Specifically, the first comparator circuit compares the size of the input signal with that of the reference signal, whereas the second comparator circuit compares the size of the reference signal with that of the opposite input signal.

The differential comparator circuit differentially compares the comparison results of the first and second comparators, and outputs the final comparison results.

If switching noise, etc., happens to be superimposed on the power source voltage, then in-phase noise is equivalently superimposed on the first and second comparator circuits. Since the differential comparator circuit differentially compares the outputs of the first and second comparator circuits, even if inphase switching noise is superimposed, that in-phase switching noise will be canceled out by the differential comparator circuit. In addition, the influence of clock feedthrough due to said switches is also reduced.

BRIEF DESCRIPTION OF THE DRAWINGS

FIG. 1 is a circuit diagram of an embodiment of the differential chopper type comparator of the present invention;

FIG. 2 is a circuit diagram of the differential comparator shown in FIG. 1;

FIG. 3 is a timing chart of waveforms for signals employed in the operation of the differential chopper type comparator of FIG. 1;

FIG. 7 is a circuit diagram of the chopper circuit employed in the differential chopper type comparator of FIG. 6;

FIG. 8 is a graph of the input voltage $V_{in}$ vs. the output voltage $V_{out}$ of the inverter included in the chopper circuit of FIG. 7; and FIG. 9 is a timing chart of waveforms for signals employed in during the operation of the differential chopper type comparator of FIG. 7.

EMBODIMENTS OF THE INVENTION

Figure 4:
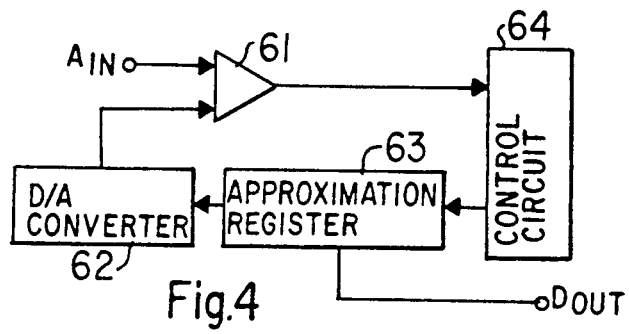
FIG. 4 is a block diagram of a successive approximation type analog-digital converter system in which the differential chopper type comparator of FIG. 1 is a component.

FIG. 1 shows a circuit diagram of an embodiment of the differential chopper type comparator of the present invention.

As shown in the figure, the following are connected in this differential chopper type comparator; switches (11)–(14), a first chopper type comparator circuit (41), a second chopper type comparator circuit (42) that is situated in parallel with this circuit (41), and a differential comparator (31). The first chopper type comparator circuit (41) consists of a comparator circuit (51) and inverted amplifier circuit (52). In the same manner, the second chopper type comparator circuit (42) consists of a comparator circuit (55) and inverted amplifier circuit (56).

The comparator circuits (51) and (55) are structured as self-correcting comparator circuits. For example, the comparator circuit (51) is built with an input capacitor (15), inverter (17), and analog switch (16), which short-circuits the inverter (17). FIG. 7 shows the circuit details of this comparator circuit (51).

The inverted amplifier circuits (52) and (56) also have circuit constructions similar to those of the comparator circuits (51) and (55). However, these circuits (52) and (56) are respectively installed as an inverted amplifier circuit with a gain of 100 times, and a circuit used to compensate for insufficiencies in the output level of the comparator circuits (51) and (55). Thus, the number of these inverted amplifier circuits may be increased as suitable according to the requirements for the differential comparator (31) signal level. In addition, since these circuits contain inverters, the input signals are inverted. Therefore, in order to match the signal polarity with the differential comparator (31), the inverters are installed as necessary.

FIG. 2 shows the circuit construction of the differential comparator (31). This differential comparator (31) uses as input signals the output signal S20 of the inverter (20), which is inside the first chopper type comparator circuit (41), and the output signal S30 of the inverter (30), which is inside the second chopper type comparator circuit (42). It outputs the comparator results corresponding to their difference as differential comparator output signals $S_{out}$ and $NS_{out}$ ($NS_{out}$ is the inverse of $S_{out}$).

The operations occurring when the differential chopper type comparator of FIG. 1 is used in an A/D converter having a resetting period and conversion period will be described below with reference to the operation timings shown in FIG. 3.

In this example, the conversion time t2 and resetting time t1, which fix the sampling cycle, are the same. In the same figure, SW11-SW14, SW16, SW19, SW26, and SW29 respectively denote the on and off states of the switches (11)–(14), (16), (19), and (26), (29) [sic].

During the resetting period, the switch (12) is turned on so that the reference voltage signal REF will be applied to the node N1 of the first chopper type comparator circuit (41). In addition, the switch (13) is turned on so that the conversion input voltage signal $S_{in}$ will be applied to the node N6 of the second chopper type comparator circuit (42). At the same time, the analog switches (16) and (19) inside the first chopper type comparator circuit (41), and the analog switches (26) and (29) inside the second chopper type comparator circuit (42) are also turned on. This allows the reference voltage signal REF to be applied to the input capacitor (15) of the comparator circuit (51), and allows the conversion input voltage signal $S_{in}$ to be applied to the input capacitor (25) of the comparator circuit (55). The input/output terminals of the inverters (17), (20), (27), and (30) are short-circuited, and as described above with reference to FIG. 8, since these inverters are automatically set to the bias points having the highest gain for the amps, the offsets of the inverters cancel each other out.

After a time t3, the switches (16) and (26) are turned off at the same time, while the switches (19) and (29) are turned off at the point at which the resetting period ends. This sequential turning off operation is used to prevent the comparator circuits (51) and (55) in the early steps from affecting the inverted amplifier circuit (52) and (56) in the following steps.

During the conversion period, the switches (19) and (29) are turned off while at the same time the switch (11) is turned on, switch (12) is turned off, switch (13) is turned off, and switch (14) is turned on, thereby allowing the conversion input voltage signal $S_{in}$ to be applied to the input capacitor (15), and allowing the reference voltage signal REF to be applied to the input capacitor (25). As a result, the following voltage, as is applied in the same manner as in Formula (1) to the input capacitor (15) of the first chopper type comparator circuit (41), to which the reference voltage signal REF had been applied during the resetting period.

$$\text{Conversion input voltage } V_{cin} - (\text{reference voltage } V_{ref} - \text{input voltage } V_{in}) \quad (2)$$

This voltage is compared with the reference voltage of the inverter (17) inside the comparator circuit (51). If the reference voltage signal REF has a voltage ($V_{ref}$) higher than the conversion input voltage signal $S_{in}$ voltage ($V_{cin}$), then the output level of the node N3 on the output end of the inverter (17) turns to the "low" level; otherwise, it turns to the "high" level. That output is applied to the inverter (20) through the coupling capacitor (18) of the inverted amplifier circuit (52), to be inversion-amplified until the designated signal level is reached.

In addition, the following voltage is applied to the input capacitor (25) of the second chopper type comparator circuit (42), to which the conversion input voltage signal $S_{in}$ had been applied during the resetting period.

$$\text{Reference voltage } V_{ref} - (\text{conversion input voltage } V_{cin} - \text{input voltage } V_{in}) \quad (3)$$

The comparator circuit (55) and inverted amplifier circuit (56) also carry out the same operations as the comparator circuit (51) and inverted amplifier circuit (52).

The signal S20 from the first chopper type comparator circuit (41), and signal S30 from the second chopper type comparator circuit (42) are input to the differential comparator (31). As formula (2) and formula (3) make clear, these signals are inverted with respect to each other. The differential comparator (31) ultimately determines whether the conversion input voltage signal $S_{in}$ or reference voltage signal REF is larger based on these input signals S20 and S30. It then outputs a comparator output signal $S_{out}$, which is a logic "1" voltage, such as 5 V, if the conversion input voltage signal $S_{in}$ is larger than the reference voltage signal REF, or a logic "0" voltage, such as 0 V, in the opposite case.

If switching noise, etc. happens to be superimposed on the power source, it will have an equal effect on the chopper type comparator in the earlier step and the chopper type comparator in the later step. As shown in FIG. 2, the differential comparator (31) is structured as a differential type comparator. Thus, the differential comparator (31) cancels out the in-phase noise caused by such switching noise to carry out the aforementioned comparison. As a result, the differential chopper type comparator shown in FIG. 1 is not affected by switching noise, etc.

In addition, although the switching noise (clock feed-through) resulting from turning on and off the switches (11)–(14), switch (16), and switch (26) causes a reduction in the precision of the A/D converter, etc., this influence is reduced tremendously in the present embodiment due to the same reasons as the aforementioned in-phase noise canceling effect.

FIG. 4 shows a block diagram of a successive approximation type A/D converter, in which the differential chopper type converter of FIG. 1 is applied.

In the same figure, the following are connected in the successive approximation type A/D converter: the differential chopper type comparator (61) of FIG. 1, a D/A converter (62), a successive approximation register (63), and control circuit (64). This successive approximation type A/D converter sequentially converts an analog input signal $A_{in}$ from the most significant bit, and compares it with the reference signal. This operation is repeated until the designated precision is reached. Specifically, the analog input signal $A_{in}$ which is to be converted is input to one of the terminals of the differential chopper type comparator (61), while the reference voltage is input to the other terminal from the D/A converter (62). The successive approximation register (63) then sequentially compares the conversion results with the reference signal. The control circuit (64) controls the operations of these circuits. Next, when the designated precision has been reached, a digital value $D_{out}$, which has been converted from the successive approximation register (63), is output.

Figure 6:
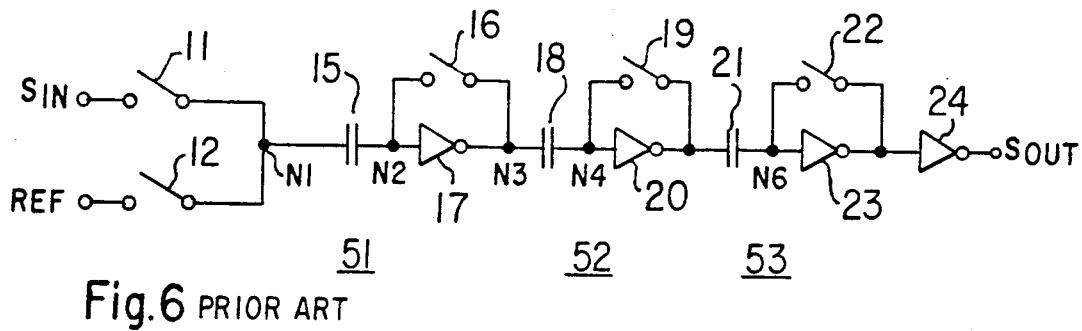
FIG. 6 is a circuit diagram of a conventional differential chopper type comparator.

Table I shows the evaluation results for the conversion precision of an 8-bit successive approximation type A/D converter in which the conventional chopper type comparator shown in FIG. 6 is used, and the conversion precision of the 8-bit successive approximation type A/D converter shown in FIG. 4, in which the differential chopper type comparator shown in FIG. 1 is used. In this evaluative experiment, a DSP and the successive approximation type A/D converter were mounted together on the same IC chip, and comparisons were made 100 times with the DSP operating at 32 MHz (ON) and stopped (OFF). The minimum values, average values, and maximum values were measured.

TABLE I

| DSP | | CONVENTIONAL | | THE PRESENT EMBODIMENT | |
|---|---|---|---|---|---|
| | | OFF | ON | OFF | ON |
| INL | MIN | 0.10 | 0.12 | 0.08 | 0.08 |
| | AV | 0.12 | 0.21 | 0.10 | 0.15 |
| | MAX | 0.15 | 0.50 | 0.12 | 0.23 |
| DNL | MIN | 0.06 | 0.08 | 0.07 | 0.07 |
| | AV | 0.09 | 0.16 | 0.08 | 0.10 |

TABLE I-continued

| DSP | | CONVENTIONAL | | THE PRESENT EMBODIMENT | |
|---|---|---|---|---|---|
| | | OFF | ON | OFF | ON |
| | MAX | 0.12 | 0.48 | 0.10 | 0.13 |

Key:
1 Conventional
2 The present embodiment

In Table I, INL refers to internal nonlinearity and DNL refers to differential nonlinearity. In addition, precision is shown in each case at the LSB (Least Significant Bit).

The A/D converter in which the conventional chopper type comparator is used has an INL maximum value of 0.50 LSB when the DSP is operating. In contrast, the A/D converter in which the differential chopper type comparator of the present embodiment is used has an INL maximum value of 0.23 LSB when the DSP is operating. In terms of DNL maximum value, 0.48 LSB was obtained with the conventional A/D converter, which is only ⅓ of the precision of 0.13 LSB obtained in the present embodiment.

Thus, even when the differential chopper type comparator of the present embodiment is mounted together with digital circuits on the same IC chip, it is not strongly affected by the switching noise generated by the digital circuits, thus making it possible to maintain A/D conversion precision at a high level.

In addition, although capacitors are also used in the A/D converter in which the differential chopper type comparator of the present embodiment is used, since they do not require a very high level of precision, it is possible to manufacture the A/D converter using a manufacturing process which is similar to the manufacturing process used in forming digital circuits.

Figure 5:
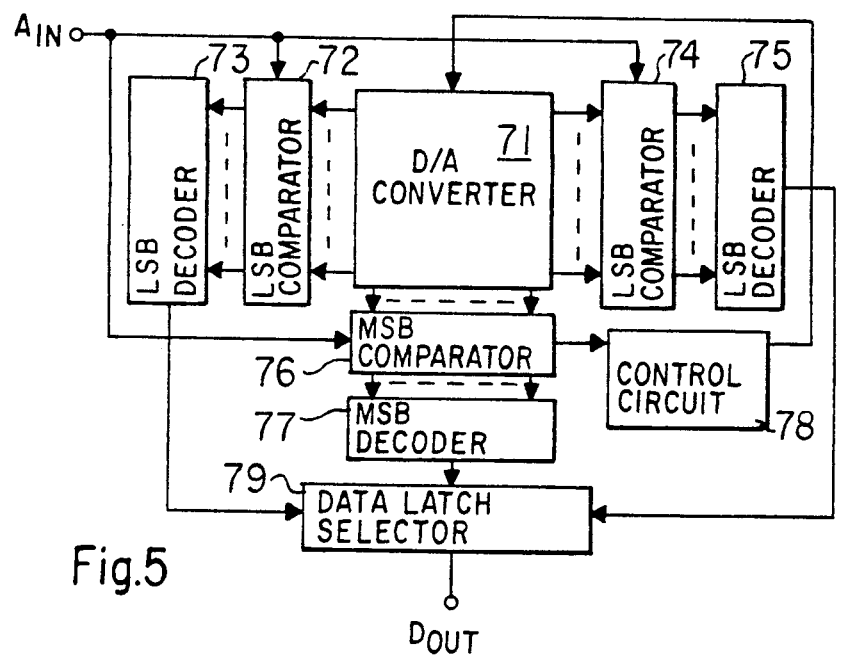
FIG. 5 is a block diagram of a series-parallel type analog-digital converter system in which the differential chopper type comparator of FIG. 1 is a component.

FIG. 5 shows a block diagram of a series-parallel type A/D converter in which the differential chopper type comparator of FIG. 1 is applied.

In this figure, the following are connected in the series parallel type A/D converter, as shown in the figure: a reference D/A converter (71), least significant bit comparator (72), least significant bit decoder (73), least significant bit comparator (74), least significant bit decoder (75), most significant bit comparator (76), most significant bit decoder (77), control circuit (78), and data latch selector (79).

The analog input signal $A_{in}$ to be converted is applied to the lower significant bit comparators (72) and (74), and to the most significant bit comparator (76). In this example, the series-parallel type A/D converter is an 8bit A/D converter in which the most significant four bits and least significant four bits are converted separately. When the most significant four bits have been determined, the reference voltage is set for the least significant four bits via the reference D/A converter (71) to convert the least significant four bits. The converted digital value $D_{out}$ is output through the data latch selector (79).

In the present example, the differential chopper type comparator of FIG. 1 is used in the least significant bit comparators (72) and (74). The reason for this is that since the most significant bit conversion is a relatively rough conversion, and since it is possible to correct the errors in the most significant bits during the least significant bit conversion, it is not particularly necessary to use the differential chopper type whereas it is necessary for converting the least significant bits, for which offset and noise precision must be rigid.

Since the circuit construction of this series-parallel type A/D converter is already well known, its operations will not be explained here.

The same level of precision was obtained with the A/D converter shown in FIG. 5 as with the A/D converter shown in FIG. 4.

Although one embodiment of the differential chopper type comparator of the present invention was described above for use in an A/D converter, it is also possible to use the differential chopper type comparator of the present embodiment in circuits other than A/D converters which also compare signals. In such cases, the resetting period and conversion period generally correspond to the first period and second period described above.

EFFECTS OF THE INVENTION

As described above, the differential chopper type comparator of the present invention is not easily affected by noise such as switching noise since first and second chopper type comparator circuits are used which perform comparison operations opposite each other.

Thus, when the differential chopper type comparator of the present invention is used in an A/D converter that is to be mounted together with digital circuits on the same semiconductor chip, it is not effected by noise, even when used in an environment with a high level of noise.

What is claimed is:

1. A differential chopper type comparator comprising:
   an input signal terminal;
   a reference signal terminal;
   a first comparator circuit including
     a first capacitor,
     a first inverter serially connected to said first capacitor,
     a first shorting line connected at the output and the input of said first inverter, and
     a first switch interposed in said first shorting line and operable between closed and open positions during respective first and second time periods to short circuit said first inverter during the first time period by assuming a closed position connecting the output and the input of said first inverter via the first shorting line;
   a second comparator circuit including
     a second capacitor,
     a second inverter serially connected to said second capacitor,
     a second shorting line connected at the output and the input of said second inverter, and
     a second switch interposed in said second shorting line and operable between closed and open positions during respective first and second time periods to short circuit said second inverter during the first time period by assuming a closed position connecting the output and the input of said second inverter via the second shorting line;
   a switching circuit connected between said input signal and reference signal terminals and said first and second comparator circuits, said switching circuit switching between a reference signal as applied at said reference signal terminal and an input signal as applied at said input signal terminal according to said first and second time periods;
   the reference signal being input from said switching circuit to said first comparator circuit during the first time period and the input signal being input from said switching circuit to said first comparator circuit during the second time period so as to compare the magnitude of the input signal with respect to the reference signal;
   the input signal being input from said switching circuit to said second comparator circuit during the first time period and the reference signal being input from said switching circuit to said second comparator circuit during the second time period so as to compare the magnitude of the reference signal with respect to the input signal; and
   a differential comparator circuit connected to the output of said first and second comparator circuits for differentially comparing the output thereof.

2. A differential chopper type comparator as set forth in claim 1, further including
   first and second inverted amplifier circuits respectively serially connected to said first and second comparator circuits;
   each of said first and second inverted amplifier circuits including
     a capacitor
     an inverter serially connected to said capacitor,
     a shorting line connected at the output and the input of said inverter, and
     a switch interposed in said shorting line and operable between closed and open positions in respective first and second time periods to short circuit said inverter during the first time period by assuming a closed position connecting the output and the input of said inverter via the shorting line.

3. A successive approximation type analog-digital converter system comprising:
   a digital-analog converter providing a reference analog signal;
   an analog signal source providing an input analog signal;
   a differential chopper type comparator having input and reference terminals for respectively receiving an input analog signal from said analog signal source and a reference analog signal from said digital-analog converter, said differential chopper type comparator comprising:
     a first comparator circuit including
       a first capacitor,
       a first inverter serially connected to said first capacitor,
       a first shorting line connected at the output and the input of said first inverter, and 'a first switch interposed in said first shorting line and operable between closed and open positions in respective first and second time periods to short circuit said first inverter during the first time period by assuming a closed position connecting the output and the input of said first inverter via the first shorting line,
     a second comparator circuit including
       a second capacitor,
       a second inverter serially connected to said second capacitor,
       a second shorting line connected at the output and the input of said second inverter, and a second switch interposed in said second shorting line and operable between closed and open positions in respective first and second time periods to short circuit said second inverter during the first time period by assuming a closed position connecting the output and the input of said second inverter via the second shorting line, a switching circuit connected between said input signal and reference signal terminals and said first and second comparator circuits, said switching circuit switching between a reference signal as applied at said reference signal terminal and an input signal as applied at said input signal terminal according to said first and second time periods, the reference signal being input from said switching circuit to said first comparator circuit during the first time period and the input signal being input from said switching circuit to said first comparator circuit during the second time period so as to compare the magnitude of the input signal with respect to the reference signal, the input signal being input from said switching circuit to said second comparator circuit during the first time period and the reference signal being input from said switching circuit to said second comparator circuit during the second time period so as to compare the magnitude of the reference signal with respect to the input signal, and a differential comparator circuit connected to the outputs of said first and second comparator circuits for differentially comparing the output thereof;

control circuit means connected to the output of said differential chopper type comparator;

successive approximation register means connected between the output of said control circuit means and the input of said digital-analog converter for sequentially comparing the conversion results from the differential chopper type comparator with the reference signal, said successive approximation register means having an output; and an output terminal connected to the output of said successive approximation register means for receiving the output therefrom as the output signal of said successive approximation type analog-digital converter system.

4. A series-parallel type analog-digital converter system comprising:

a digital-analog converter for providing a reference signal;

an analog signal source providing an input analog signal;

first and second least-significant bit comparators respectively comprising first and second differential chopper type comparators having input and reference terminals for respectively receiving an input analog signal from said analog signal source and a reference analog signal from said digital-analog converter, each of said first and second differential chopper type comparators comprising:

a first comparator circuit including
 a first capacitor,
 a first inverter serially connected to said first capacitor,
 a first shorting line connected at the output and the input of said first inverter, and
 a first switch interposed in said first shorting line and operable between closed and open positions during respective first and second time periods to short circuit said first inverter during the first time period by assuming a closed position connecting the output and the input of said first inverter via the first shorting line, a second comparator circuit including
 a second capacitor,
 a second inverter serially connected to said second capacitor,
 a second shorting line connected at the output and the input of said second inverter, and
 a second switch interposed in said second shorting line and operable between closed and open positions during respective first and second time periods to short circuit said second inverter during the first time period by assuming a closed position connecting the output and the input of said second inverter via the second shorting line, respective switching circuits connected between said input signal and reference signal terminals for each of said first and second differential chopper type comparators and said first and second comparator circuits thereof, each of said switching circuits switching between a reference signal as applied at said reference signal terminal by said digital-analog converter and an input signal as applied at said input signal terminal from said analog signal source according to said first and second time periods, the reference signal being input from said switching circuit to said first comparator circuit of the corresponding one of said first and second differential chopper type comparators during the first time period and the input signal being input from said switching circuit to said first comparator circuit during the second time period so as to compare the magnitude of the input signal with respect to the reference signal for each of said first and second differential chopper type comparators, the input signal being input from said switching circuit to said second comparator circuit of the corresponding one of said first and second differential chopper type comparators during the first time period and the reference signal being input from said switching circuit to said second comparator circuit during the second time period so as to compare the magnitude of the reference signal with respect to the input signal for each of said first and second differential chopper type comparators, and respective differential comparator circuits connected to the outputs of said first and second comparator circuits for each of said first and second differential chopper type comparators for differentially comparing the output thereof;

first and second least-significant bit decoders respectively connected to said first and second least-significant bit comparators as defined by said first and second differential chopper type comparators;

a most-significant bit comparator connected to the output of said digital-analog converter for receiving a reference signal therefrom and connected to said analog signal source for receiving an input analog signal therefrom;
a most-significant bit decoder connected to the output of said most-significant bit comparator;
control circuit means connected between the outputs of said most-significant bit comparator and the input of said digital-analog converter;
data latch selector means connected to the output of said most-significant bit decoder and said first and second least-significant bit decoders for producing an output signal; and
an output signal terminal connected to the output of said data latch selector means from which the output signal of the series-parallel type analog-digital converter system is provided.

* * * * *